United States Patent [19]
Nauta

[11] Patent Number: 5,117,205
[45] Date of Patent: May 26, 1992

[54] ELECTRICALLY CONTROLLABLE OSCILLATOR CIRCUIT, AND ELECTRICALLY CONTROLLABLE FILTER ARRANGEMENT COMPRISING SAID CIRCUITS

[75] Inventor: Bram Nauta, Almelo, Netherlands

[73] Assignee: U.S. Philips Corporation, New York, N.Y.

[21] Appl. No.: 685,240

[22] Filed: Apr. 12, 1991

[30] Foreign Application Priority Data

May 1, 1990 [NL] Netherlands ............................ 9001034

[51] Int. Cl.$^5$ ............................................. H03B 5/00
[52] U.S. Cl. ..................... 331/117 FE; 307/521; 331/34; 331/132; 331/167; 333/214
[58] Field of Search .................... 331/34, 115, 117 R, 331/117 FE, 132, 167; 307/521, 526; 333/214, 215

[56] References Cited

U.S. PATENT DOCUMENTS 4,145,670 3/1979 Bode ................................... 331/135
4,760,353 7/1988 Perkins ............................... 331/132
4,818,903 4/1989 Kawano .............................. 307/521

Primary Examiner—Siegfried H. Grimm
Attorney, Agent, or Firm—Bernard Franzblau

[57] ABSTRACT

An electrically controllable oscillator circuit (30) comprises two balanced transconductance circuits (G1, G2), each including transistor pairs arranged as inverters (Inv14) and as resistors (Inv5-6). The oscillation frequency (f) and the quality factor (Q) of the oscillator circuit (30) are controlled by means of a single control signal provided by a combined control circuit (Inv7, Dif, IM1, IM2). The current mirror circuit (IM1, IM2) and a differential pair (Dif) derived the control signal for adjusting the quality factor (Q) from a resistor-connected further transistor pair (Inv7) connected to the control signal for adjusting the frequency (f). The quality factor of an electrically controllable filter arangement including similar transconductance circuits (G-3-9) is adjusted by means of the control signal generated by the control circuit via a buffer circuit (B) and a low-pass circuit (C3).

14 Claims, 5 Drawing Sheets

ELECTRICALLY CONTROLLABLE OSCILLATOR CIRCUIT, AND ELECTRICALLY CONTROLLABLE FILTER ARRANGEMENT COMPRISING SAID CIRCUITS

BACKGROUND OF THE INVENTION

This invention relates to an an electrically controllable oscillator circuit (VCO), comprising:

a first (G1) and a second (G2) balanced transconductance circuit, each having a non-inverting (Vi+) and an inverting (Vi−) input terminal, a non-inverting (Vo+) and an inverting (Vo−) output terminal, a first (Vd1) and a second (Vd2) power-supply terminal and a signal ground terminal (E), the non-inverting input terminal (Vi+) of the first transconductance circuit (G1) being connected to the inverting output terminal (Vo−) of the second transconductance circuit (G2), the inverting input terminal (Vi−) of the first transconductance circuit (G1) being connected to the non-inverting output terminal (Vo+) of the second transconductance circuit (G2), the non-inverting output terminal (Vo+) of the first transconductance circuit (G1) being connected to the non-inverting input terminal (Vi+) of the second transconductance circuit (G2), and the inverting output terminal (Vo−) of the first transconductance circuit (G1) being connected to the inverting input terminal (Vi−) of the second transconductance circuit (G2), the first power-supply terminals (Vd1) of the two transconductance circuits (G1, G2) being interconnected and constituting a first control-signal terminal (Vdd1), the second power-supply terminals (Vd2) of the two transconductance circuits (G1, G2) being interconnected and constituting a second control-signal terminal (Vdd2), and the signal ground terminals (E) of the two transconductance circuits (G1, G2) being connected to the signal ground of the oscillator circuit (VCO), first (C1) and second (C2) capacitive means being connected to the output terminals (Vo+, Vo−) of the first (G1) and the second (G2) transconductance circuit, respectively, during operation, the first (G1) and the second (G2) transconductance circuit each comprising a first (Inv1), a second (Inv2), a third (Inv3) and a fourth (Inv4) transistor pair of a first type and a fifth (Inv5) and a sixth (Inv6) transistor pair of a second type, each having an input and an output electrode, a power-supply electrode and a signal ground electrode, the input electrode of the first transistor pair (Inv1) being connected to the non-inverting input terminal (Vi+) and the input electrode of the second transistor pair (Inv2) to the inverting input terminal (Vi−), the output electrode of the first transistor pair (Inv1) being connected to the inverting output terminal (Vo−) and the output electrode of the second transistor pair (Inv2) to the non-inverting output terminal (Vo+), the input electrode of the third transistor pair (Inv3) being connected to the output electrode of the first transistor pair (Inv1) and the input electrode of the fifth transistor pair (Inv5) to the output electrode of the second transistor pair (Inv2), said third (Inv3) and said fifth (Inv5) transistor pair having their output electrodes interconnected, the input electrode of the fourth transistor pair (Inv4) being connected to the output electrode of the second transistor pair (Inv2) and the input electrode of the sixth (Inv6) transistor pair to the output electrode of the first transistor pair (Inv1), said fourth (Inv4) and said sixth (Inv6) transistor pair having their output electrodes interconnected, and the power-supply electrodes of the first (Inv1), the second (Inv2), the third (Inv3) and the fourth (Inv4) transistor pair being connected to the first power-supply terminal (Vd1), the power-supply electrodes of the fifth (Inv5) and the sixth (Inv6) transistor pair being connected to the second power-supply terminal (Vd2), and the signal ground electrodes of the transistor pairs being connected to the signal ground terminal (E) of the transconductance circuit (G1, G2), a transistor pair of the first type (Inv1, Inv2, Inv3, Inv4) comprising two complementary transistors (Tn, Tp) whose main current paths are arranged in series via a connecting point forming the output electrode and whose control electrodes are interconnected to form the input electrode, said series arrangement having end points constituting the power-supply electrode and the signal ground electrode, respectively, in a way such that in operation the transistors can operate in their saturation regions, and a transistor pair of the second type (Inv5, Inv6) of a structure similar to a transistor pair of the first type (Inv1, Inv2, Inv3, Inv4) whose input and output electrodes are interconnected.

An oscillator circuit comprising two coupled balanced input, single output transconductance circuits, each loaded with a capacitor, is known from U.S. Pat. No. 4,760,353. The transconductance circuits themselves are described in "Linear CMOS Transconductance Element for VHF Filters" by B. Nauta and E. Seevinck, Electronic Letters, Vol. 25, no. 7, Mar. 30, 1989, pp. 448–450.

In practice, transconductance circuits are employed inter alia as electronic equivalents for inductances such as coils. Analog filter arrangements comprising transconductance circuits can be constructed advantageously as integrated semiconductor circuits, to which the required capacitors can be added separately or in which said capcitors can be incorporated directly in the substrate of the semiconductor circuits themselves.

An analog filter arrangement comprising transconductance circuits with transistor pairs as mentioned in the foregoing is described in "A 110 MHz CMOS Transconductance-C Low-Pass Filter" by B. Nauta and E. Seevinck, Digest of Technical Papers ESSCIRC, 89, Vienna, Sep. 20–22, 1989, pp. 141–144.

Since the frequency parameters of these active filters are determined mainly by the components of the transconductance circuits and the capacitors, accurate exactly dimensioned component values should be employed for this purpose. As these are generally not available or only at high cost, it is necessary for the filters to be adjustable. In fully integrated filter arrangements, in which for example all the components are formed in a silicon substrate, an electronic adjustment facility should be provided. Since the fabrication of integrated semiconductor circuits is subject to tolerances and the values of the components used can change as a result of aging and temperature fluctuations, manual adjustment of filter parameters is generally not possible or is not accurate enough. For this reason an automatic adjustment is to be preferred.

For the adjustment or correction of the filter parameters it is necessary to measure the instantaneous filter parameters to compare these parameters with the desired filter action, to determine a possible deviation and when necessary to perform a correction to reduce such a deviation.

British Patent Application 2,194,402 reveals a method employed in practice, in which the response to a reference signal is determined. In the case that a deviation is detected the required corrections are applied via a suitable control circuit. Instead of subjecting the filter itself to the reference signal an auxiliary circuit is used which is identical or substantially identical to the filter. The correction signal generated for this auxiliary circuit is employed for correcting the filter response. Such a system is also referred to as a "master slave system", the auxiliary circuit being the "master" and the filter being "the slave".

The article "Design of continuous-time fully integrated filters: a review", by F. Schaumann, IEEE - Proceedings. vol 136, Pt. G, no. 4, August 1989, pp. 184–190 describes inter alia a master slave system in which the master is a voltage-controlled oscillator circuit (VCO). This VCO comprises a representative substructure of the filter (the slave).

The frequency response of, for example, an integrated active filter is generally corrected by adjusting the cut-off frequency (f-tuning) and/or the quality factor (Q-tuning). A change in the f-tuning generally also results in a change in the quality factor of the filter circuit, which may manifest itself in an undesirable change in the amplitude of the filter response, which requires correction of the Q-tuning. In general, two separate control circuits are employed for the f-tuning and the Q-tuning.

SUMMARY OF THE INVENTION

It is an object of the invention to provide a combined f- and Q-tuning circuit for an oscillator circuit of the type defined in the opening paragraph, in particular for use in master slave filter arrangements. This should be effected in such a way that regardless of the frequency of the oscillator circuit adjusted by means of the f-tuning circuit the amplitude thereof remains within the desired range considered to be normal for the relevant circuit. In other words, the amplitude of the oscillator signal should not change or should hardly change when the frequency of this signal is adjusted.

According to the invention this is achieved by means of a control circuit comprising a seventh transistor pair (Inv7) of a third type, whose circuit structure corresponds to that of the transistor pair (Inv5, Inv6) of the second type and in which the active dimensions of the transistors (Tn, Tp) correspond to those of the corresponding transistors (Tn, Tp) of a transistor pair (Inv1, Inv2, Inv3, Inv4) of the first type, said seventh transistor pair (Inv7) having its power-supply electrode connected to the second control-signal terminal (Vdd2) and its signal ground electrode to the signal ground of the oscillator circuit (VCO), and having its output electrode connected to the control electrodes of a differential transistor pair (Dif) via first (Vb1) and second (Vb2) direct voltage sources of opposite polarity, the main current paths of the transistors (T1, T2) of said differential pair (Dif) being arranged in parallel between the second control-signal terminal (Vdd2) and an input (32) of a first current mirror circuit (IM1) having a supply terminal connected to signal ground, which first current mirror circuit (IM1) has an output (33) connected to an input (34) of a second current mirror circuit (IM2), which second current mirror circuit (IM2) has a separate power-supply terminal (36), the first control-signal terminal (Vdd1) of the oscillator circuit (VCO) being connected to an output (35) of said second current mirror circuit (IM2).

The oscillator circuit in accordance with the invention oscillates at a frequency which is dictated by the value of a first control signal applied to the first control-signal terminal associated with the transistor pairs of the first type. Each value of this first control signal corresponds to only one value of a second control signal to be applied to the second control-signal terminal associated with the transistor pairs of the second type, resulting in the correct quality factor. The reverse is also true. The oscillation frequency can also be adjusted with a second control signal when the first control signal is supplied by the Q-tuning circuit.

This last-mentioned possibility is utilized in the oscillator circuit in accordance with the invention for coupling the f- and Q-tuning circuits to each other via the control circuit. By means of this control circuit a control signal, for application to the first control signal terminal, i.e. for adjusting the quality factor of the oscillator circuit, is derived from the second control signal, which in this case is employed for adjusting the frequency of the oscillator circuit.

The control circuit in accordance with the invention is based on the recognition of the fact that, when the transistors are operated in their saturation regions, the current in the main current path of a transistor pair having the circuit design of a transistor pair of the second type depends in a corresponding manner on the transistor parameters as the quiescent current in the first control-signal terminal of the oscillator circuit, i.e. in the non-oscillating state thereof. When said transistor pair comprises transistors whose active regions have dimensions corresponding to those of the corresponding transistors of a transistor pair of the first type, the main current in such a transistor pair, referred to as being of the third type hereinbefore, is found to be a factor of four smaller than the quiescent current in the first control-signal terminal. In the case where the oscillator circuit produces an oscillation signal the current in the first control-signal terminal thereof is larger, depending upon the signal amplitude, but is constant. In the control circuit of the oscillator circuit in accordance with the invention this difference between the quiescent current and the operating current of the oscillator circuit is compensated for by means of the differential pair and the two direct voltage sources of opposite polarity connected thereto.

By now applying the second control signal, for adjusting the frequency of the oscillator circuit to such a transistor pair of the third type, in the present case the said seventh transistor pair, and by deriving the correct value of the current to be applied to the first control-signal terminal of the oscillator circuit, i.e. for adjusting the quality factor of this circuit, from the current through this transistor pair via the differential transistor pair with the two direct voltage sources and the two current mirror circuits, an appropriate control signal for adjusting the correct quality factor is obtained via the control circuit for every change of the frequency.

A change, caused for example by temperature effects or aging, of the parameters of the transistors of the transistor pairs of the second type in the transconductance circuits to which the second control signal for adjusting the frequency of the oscillator signal is applied via the second control-signal terminal, will automatically lead to a correction of the quality factor via said seventh transistor pair. This applies in particular to an oscillator circuit formed as an integrated semiconductor circuit in one substrate.

The control circuit employed in the oscillator circuit in accordance with the invention enables a separate Q-tuning circuit to be dispensed with. The Q-tuning circuits used in practice, which determines a control signal for adjusting the quality factor on the basis of the output signal of the oscillator circuit, are found to impose a limitation on the maximum oscillator frequency. The principal cause for this resides in the inevitable parasitic capacitances and signal tappings in these Q-tuning circuits, which at frequencies in the VHF (Very High Frequency) range, i.e. around 100 MHz, inter alia seriously limit the bandwidth of such Q-tuning circuits. Moreover, they produce undesired signal phase shifts. The control circuit employed in the oscillator circuit in accordance with the invention does not comprise any signal tapping points and rectifiers etc. As a result of this, the oscillator circuit is suitable for use in the high to very high frequency range.

The direct voltage sources in the control circuit dictate the amplitude of the output signal of the oscillator circuit. Their values therefore depend on the desired output amplitude and on the supply voltage of the oscillator circuit. By an appropriate choice of the voltage values supplied by the two direct voltage sources in relation to the signal amplitude of the oscillator circuit, a constant ratio having a magnitude of a factor of four can be obtained between the current in the first control-signal terminal and the sum current of the main current path of the transistors of the differential pair.

The quadrupled representation of the sum current of the differential pair of the control circuit, to be applied to the first control-signal terminal of the oscillator circuit, can be realised in various suitable manners.

In a further embodiment of the oscillator circuit in accordance with the invention the first current mirror circuit is adapted to supply an output current which is x times as large as its input current and the second current mirror circuit is adapted to supply an output current which is 4/x times as large as its input current, the forward transconductance of the transistors of the differential pair and the transistors of the seventh transistor pair being equal or substantially equal. Here, x is a positive non-zero integer. In the preferred embodiment $x=1$.

This last-mentioned embodiment is advantageous because in this case the first current mirror circuit extracts only a current of the magnitude of the main current in the seventh transistor pair from the second control signal for adjusting the frequency of the oscillator circuit. The larger current to be applied to the oscillator circuit is taken from said separate power-supply terminal via the second current mirror circuit.

Since the current mirror circuits inter alia amplify the inevitable quiescent and error currents of the differential pair by a factor of four, which is obviously undesirable, the required quadruple representation of the sum current of the differential pair is obtained in yet another embodiment of the invention by increasing the forward transconductance of the transistors of the differential pair in comparison with the forward transconductance of the transistors of said seventh transistor pair. The desired current for adjusting the quality factor of the oscillator circuit can also be obtained by giving the transistors of the differential pair a forward transconductance which is, for example, four times as large as that of the transistors of the seventh transistor pair, and by adapting the two current mirror circuits to supply output currents equal to their respective input currents In general terms this means that if the transistors of the differential pair have a forward transconductance which is y times as large as that of the transistors of the seventh transistor pair, and the first current mirror circuit is adapted to supply an output current which is x times as large as its input current, the second current mirror circuit should be adapted to supply an output current which is $4/(x.y)$ times as large as its input current. In this case x and y are both positive non-zero integers.

The oscillator circuit in accordance with the invention is very suitable for fabrication as an integrated semiconductor circuit comprising transistors of the insulated-gate type. Preferably the geometries of the transistors are selected in a manner such that in operation the current densities in the transistors are equal to the largest possible extent, in particular for the transistors of the same conductivity type. This ensures that in operation all the transistors operate as far as possible at the same temperature, which is advantageous to maintain the relationships between their parameters.

By means of bipolar transistors accurate current mirror circuits can be realised owing to the absence of threshold voltages in these transistors. Bipolar transistors as well as insulated-gate transistors can be realised in one and the same semiconductor substrate by means of inter alia the BIMOS technology (BIpolar Metal Oxide Silicon).

In general the currents through the transistors, when operated in the saturation region, will not be exact square-law functions of the applied actuating voltage. The currents will contain upper harmonics of the oscillation frequency of the oscillator. In still another embodiment of the oscillator circuit in accordance with the invention, in order to apply the output signal of the oscillator circuit to, for example, an electrically controllable filter arrangement, there is provided a buffer circuit having an input and an output terminal, the input terminal being connected to the first control-signal terminal of the oscillator circuit via an interposed low-pass circuit, the output terminal of the buffer circuit constituting a control-signal output terminal of the oscillator circuit.

Suitably, the low-pass circuit is a capacitive element arranged between the input terminal of the buffer circuit and the signal ground of the oscillator circuit. This element may be an externally connected capacitor, but also may be, for example, a diode-junction formed in a semiconductor substrate.

The invention also relates to an electrically controllable filter arrangement comprising one or more transconductance circuits of the type defined in the opening paragraph, having a first and a second control-signal terminal, and an electrically controllable oscillator circuit in conformity with one or more of the embodiments described above, the first control-signal terminal of the filter arrangement being connected to the control-signal output terminal of the oscillator circuit and the second control-signal terminal of the filter arrangement being connected to the second control-signal terminal of the oscillator circuit.

Such a filter arrangement is suitable for use up to frequencies within the VHF range and, in particular, for implementation as an integrated semiconductor circuit.

BRIEF DESCRIPTION OF THE DRAWINGS

The invention will now be described in more detail, by way of example, with reference to the drawings which diagrammatically show an embodiment of the oscillator circuit and of a filter arrangement comprising insulated-gate transistors, referred to as metal oxide silicon transistors (MOS transistors) in the literature.

DESCRIPTION OF THE PREFERRED EMBODIMENTS

Hereinafter it is assumed that in operation all the transistors can operate in their saturation regions.

Figure 1:
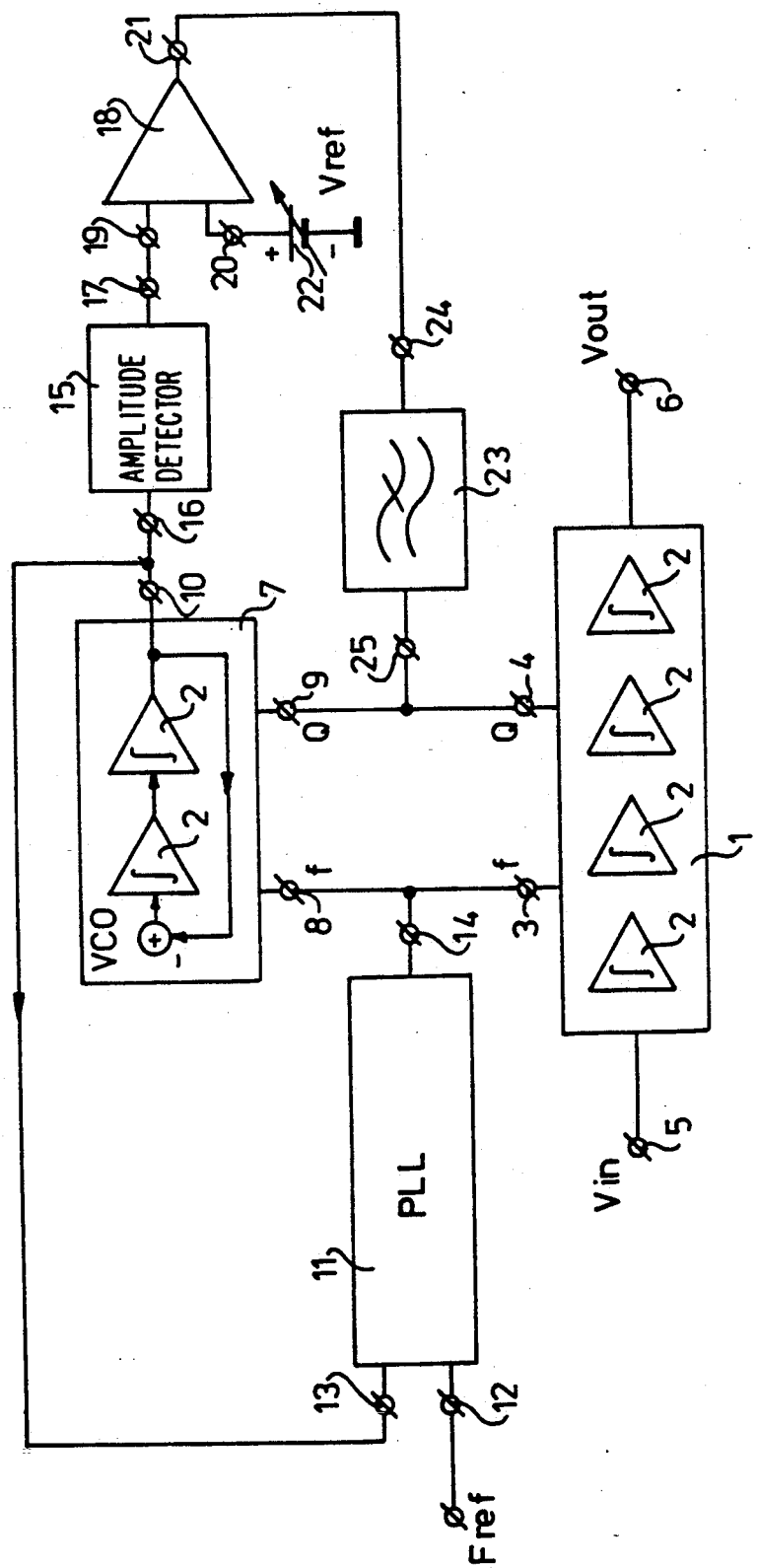
FIG. 1 is a basic diagram of a prior-art electrically controllable filter arrangement using the master-slave principle.

FIG. 1 is a general basic diagram of an active filter arrangement comprising f- and Q-tuning circuits in accordance with the master-slave principle. The filter 1, which comprises a plurality of integrators 2, has two control inputs 3, 4 for applying a control signal for the adjustment of the cut-off frequency and the quality factor of the filter 1. An input signal Vin applied to the input 5 of the filter 1 results in an output signal Vout on the output 6 of the filter, the transmission ratio between these signals being dependent upon the construction of the filter and the signals applied to the control inputs 3, 4. In general, the signals will be direct voltages or direct currents.

For the purpose of generating these control signals there is provided an auxiliary circuit in the form of a voltage-controlled oscillator 7 ("VCO") comprising a plurality of integrators 2 of the type as used in the filter 1. This auxiliary circuit functions as the master for applying suitable control signals to the slave, the filter 1. For this purpose the voltage-controlled oscillator 7 also has two control inputs 8, 9 for adjusting the oscillation frequency (f) and a quality factor (Q) respectively, said factor determining inter alia the amplitude of the oscillator output signal appearing on the output 10.

The f-tuning circuit comprises a phase-locked loop circuit 11 (PLL) having two inputs 12, 13 and an output 14. The input 13 of the phase-locked loop circuit 11 is connected to the output 10 of the oscillator 7. The output 14 of the phase-locked loop 11 is connected to the control input 3 of the filter 1 and to the control input 8 of the oscillator 7. By means of this phase-locked loop circuit 11 the oscillation frequency of the oscillator 7 is locked to a reference frequency Fref applied to the input 12 of the phase-locked loop circuit 11.

When the oscillator circuit 7 and the filter 1 are formed as an integrated circuit on one semiconductor substrate both circuits will be exposed to substantially the same environmental influences and, on account of their similar construction, they will respond similarly to variations of the environmental influences. Any deviation from the desired oscillation frequency of the oscillator, for example as a result of an ambient temperature variation, the influence of humidity or aging, is now corrected in a suitable manner via the phase-locked loop circuit 11. Since the oscillator circuit 7 is a representative replica of the filter 1 the cut-off frequency of this filter will also be corrected in a suitable manner via the phase-locked loop circuit 11.

In order to achieve that the amplitude of the output signal of the oscillator circuit 7 also remains constant there is provided a Q-tuning circuit comprising an amplitude detector 15 having an input 16 and an output 17 and connected to the output 10 of the oscillator 7. The output signal of the amplitude detector 15 is applied to an input 19 of a comparator 18, a d.c. reference signal Vref being applied to the other input 20 of said comparator. In the Figure this is shown diagrammatically as a variable direct voltage source 22 whose positive terminal (+) is connected to the input 20 and whose negative terminal (−) is connected to the signal ground of the arrangement. The signal on the output 21 of the comparator 18 is applied to the input 24 of a low-pass circuit 23. The output 25 of this low-pass circuit 23 is connected to the control input 4 of the filter 1 and to the control input 9 of the oscillator circuit 7. Any deviation of the amplitude of the output signal of the oscillator circuit 7 relative to the reference signal Vref results in a suitable control signal on the output 25 of the low-pass circuit 23 for the correction of the quality factor of the oscillator circuit 7 and, consequently, of the filter 1.

For filter arrangements in the high and very high frequency range (VHF range) the Q-tuning circuit should be fast enough to correct the oscillator circuit 7, which oscillates at least at the cut-off frequency of the filter. However, it is in particular at these high frequencies that inter alia parasitc capacitances have a very adverse effect on the bandwidth of the Q-tuning circuit and hence its speed of response. In practice, filter arrangements of this type for use at high frequencies can therefore be manufactured with difficulty or only at a substantial expense.

Figure 2:
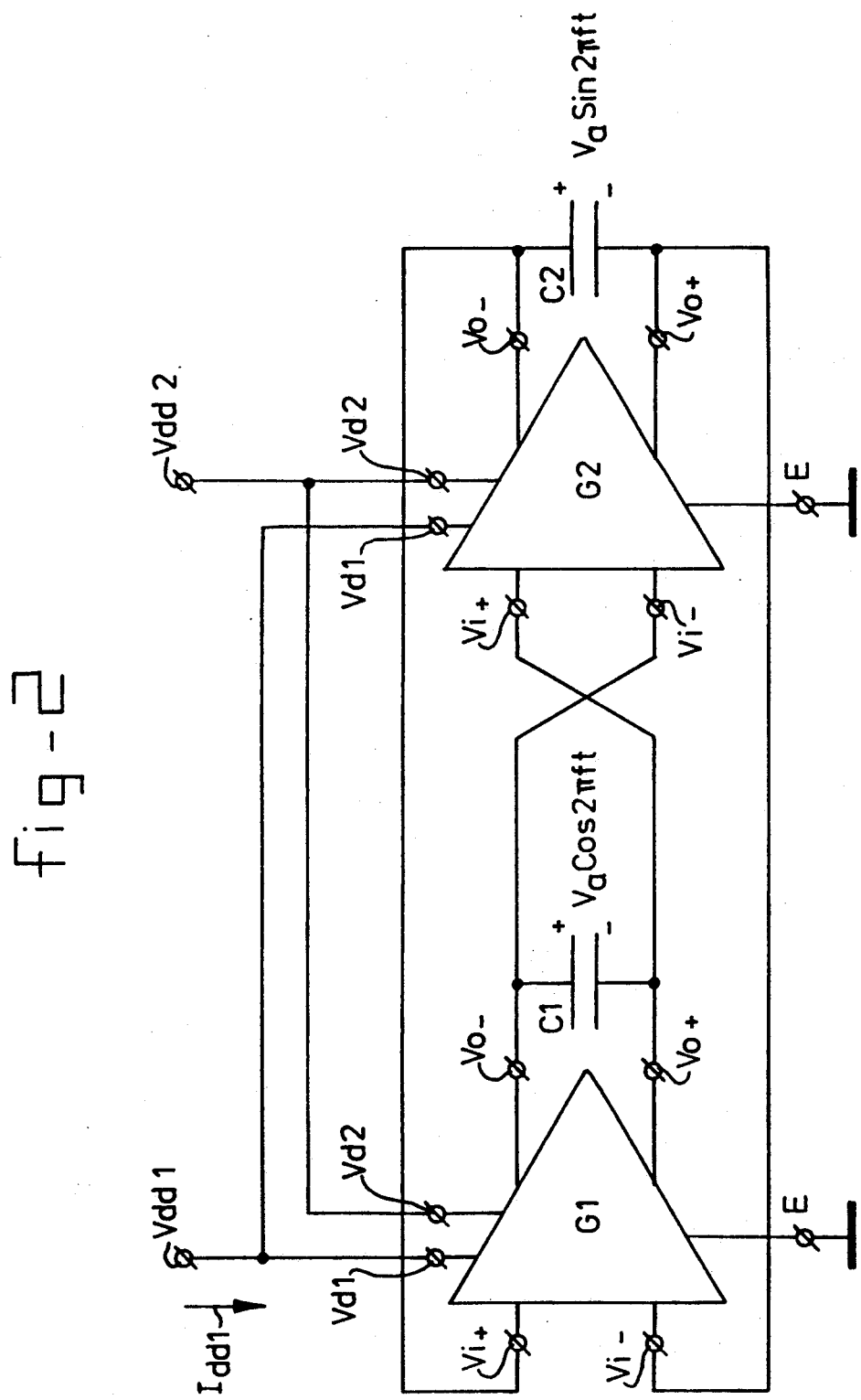
FIG. 2 is a basic diagram of the oscillator circuit in accordance with the invention comprising two identical balanced transconductance circuits.

FIG. 2 shows an oscillator circuit suitable for use in active filter arrangements. This oscillator circuit comprises two basically identical balanced transconductance circuits G1, G2. Each transconductance circuit has a non-inverting input terminal Vi+, an inverting input terminal Vi−, a non-inverting output terminal Vo+, an inverting output terminal Vo−, a first power-supply terminal Vd1, a second power-supply terminal Vd2, and a signal ground terminal E.

As is shown in the Figure, the non-inverting output terminal Vo+ of the transconductance circuit G1 is connected to the non-inverting input terminal Vi+ of the second transconductance circuit G2 and the inverting output terminal Vo− of the first transconductance circuit G1 is connected to the inverting input terminal Vi− of the second transconductance circuit G2. The input terminals Vi+, Vi− of the first transconductance circuit G1 are connected to the output terminals Vo− and Vo+, respectively, of the second transconductance circuit G2. Capacitors C1 and C2 are arranged between the respective output terminals of the first and the second transconductance circuits G1, G2. The first power-supply terminals Vd1 of the two transconductance circuits G1, G2 are interconnected and constitute a first control-signal terminal Vdd1, the interconnected second power-supply terminals Vd2 of the two transconductance circuits G1, G2 constituting a second control-signal signal terminal Vdd2. The signal-ground terminals E of G1, G2 are connected to the signal ground of the oscillator circuit, represented as a short horizontal line.

In operation the voltages across the capacitors C1 and C2 are 90° phase shifted, resulting in voltages $V_a \cos 2\pi ft$ and $V_a \sin 2\pi ft$, in which the oscillation frequency f is determined by the relationship $f = \frac{1}{2} gmd/(\pi C)$, where gmd is the transconductance parameter between the input and the output of the transconductance circuit. The transconductance parameter gmd and hence the oscillation frequency and the quality factor of the oscillator circuit further depend upon the amplitude of the signal applied to the two control-signal terminals Vdd1, Vdd2. In general, these signals are direct voltages. However, it is also possible to use direct currents.

Instead of connecting a capacitor C1, C2, as shown, between the output terminals Vo−, Vo+ of a transconductance circuit G1, G2, a similar effect can be obtained by connecting a capacitor (not shown) between each output terminal and the signal ground E. In integrated semiconductor circuits the use of capacitors connected to signal ground has advantages with respect to the fabrication technology.

Figure 3:
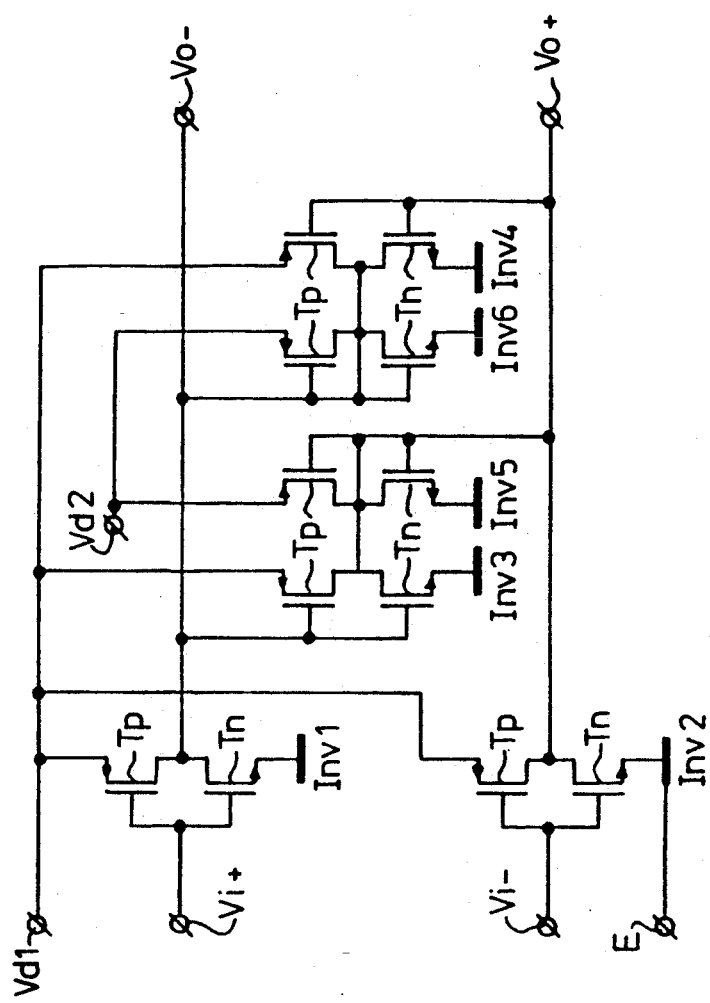
FIG. 3 is a basic diagram of the structure of the transconductance circuit shown, in FIG. 2.

The internal structure of the transconductance circuits G1, G2 is shown diagrammatically in FIG. 3. Each of the transconductance circuits comprises six transistor pairs Inv1–Inv6 comprising complementary transistors. Each transistor pair comprises a P-channel MOS transistor (PMOS), referred to as Tp, and an N-channel MOS transistor (NMOS), referred to as Tn. Transistors of the same conductivity type are identical as far as possible.

The circuit comprises transistor pairs of two different types, i.e. of a first type Inv1–4 and of a second type Inv5–6.

The transistors of a transistor pair of the first type have both gate electrodes or control electrodes interconnected to form an input electrode, the interconnected drain electrodes of the transistors constituting the output electrode of the relevant transistor pair. The source electrode of the P-channel transistor Tp is connected to the first power-supply terminal Vd1 and the source electrode of the N-channel transistor Tn is connected to the signal ground terminal E, indicated by a short horizontal line in the Figure. A transistor pair of the second type Inv5–6 differs from a transistor pair of the first type Inv1–4 in that the input and the output electrode are interconnected and the source electrode of the relevant P-channel transistor Tp is connected to the second power-supply terminal Vd2.

The input electrodes of the first and the second transistor pair constitute the non-inverting input terminal Vi+ and the inverting input input terminal Vi− of the transconductance circuit. Their output electrodes constitute the inverting output terminal Vo− and the non-inverting output terminal Vo+ of the relevant transconductance circuits. Both transistor pairs Inv1, 2 provide the VI conversion of the transconductance circuit.

The four other transistor pairs Inv3–6 of the transconductance circuit serve for adjusting the in-phase or common-mode levels of the voltages on the non-inverting and inverting output terminals relative to signal ground. For this purpose the transistor pair Inv3 has its input electrode connected to the output electrode of the first transistor pair Inv1 and the fourth transistor pair Inv4 has its input electrode connected to the output electrode of the second transistor pair Inv2. The combined input/output electrode of the fifth transistor pair Inv5 is connected to the output electrode of the second transistor pair Inv2 and of the third transistor pair Inv3. The combined input/output electrode of the sixth transistor pair Inv6 is connected to the output electrode of the first transistor pair Inv1 and the fourth transistor pair Inv4. The two transistor pairs Inv5, 6 behave as resistances during operation, the output current of the third transistor pair Inv3 and the fourth transistor pair Inv4 being injected into the associated resistor-connected transistor pair Inv5 and Inv6, respectively.

When corresponding transistor pairs have the same geometries and transconductance parameters the network Inv3–Inv6 will constitute a low-impedance load for common mode signals and a high-impedance load for anti-phase or differential mode signals at the same supply voltage, resulting in a controlled common mode voltage level of the output terminals Vo+, Vo− of the transconductance circuit.

For a more detailed explanation of the operation of this circuit reference is made to the article "Linear CMOS Transconductance Element for VHF Filters" mentioned in the introductory part of this application.

When it is assumed that the oscillator circuit shown in FIG. 2 oscillates harmonically with a signal amplitude $V_a$ at a frequency f and the corresponding transistors of the transistor pairs of the first type Inv1–4 have the same or substantially the same active dimensions, it can be demonstrated that the current Idd1 in the first control-signal terminal Vdd1 complies with:

$$Idd1 = 2\beta p \left\{ 2 \left[ \frac{\sqrt{(\beta n/\beta p)}}{1 + \sqrt{(\beta n/\beta p)}} (Vdd1 - Vtn - |Vtp|) \right]^2 + \frac{1}{4} V_a^2 (\sin^2 2\pi ft + \cos^2 2\pi ft) \right\} \quad (1)$$

and, since $\sin^2 2\pi ft + \cos^2 2\pi ft = 1$, this may be written as:

$$Idd1 = 2\beta p \left\{ 2 \left[ \frac{\sqrt{(\beta n/\beta p)}}{1 + \sqrt{(\beta n/\beta p)}} (Vdd1 - Vtn - |Vtp|) \right]^2 + \frac{1}{4} V_a^2 \right\} \quad (2)$$

where:
- Idd1 = currents in the first control-signal terminal (A),
- Vdd1 = direct voltage on the first control-signal terminal (V),
- Vtn = threshold voltage NMOS transistor Tn Inv1-4 (V),
- Vtp = threshold voltage PMOS transistor Tp Inv1-4 (V),
- $\beta$n = transconductance parameter NMOS transistor Tn Inv1-4 (A/V$^2$),
- $\beta$p = transconductance parameter PMOS transistor Tp Inv1-4 (A/V$^2$), and
- $V_a$ = amplitude of the oscillation signal (V).

Figure 4:
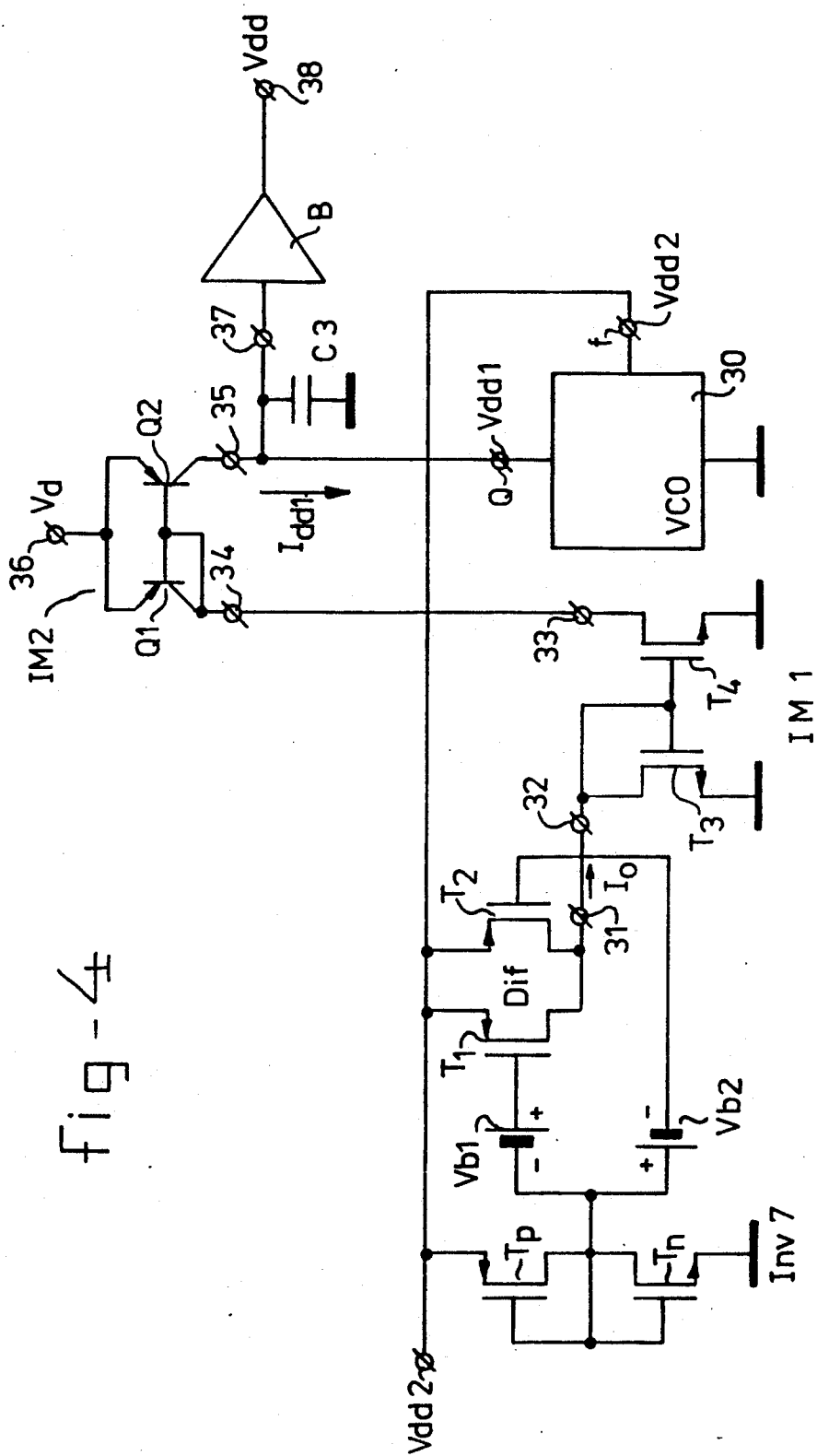
FIG. 4 is the basic diagram of the control circuit employed in the oscillator circuit in accordance with the invention.

In FIG. 4 the reference numeral 30 denotes an oscillator circuit constructed as shown in FIG. 2, having a first control-signal terminal Vdd1 and a second control-signal terminal Vdd2 for controlling the quality factor Q and the oscillator frequency f respectively. The control circuit used in accordance with the invention comprises a seventh transistor pair Inv7 of a third type, whose circuit structure corresponds to the transistor pair of the second type. The transistor Tp has its source electrode connected to the second control-signal terminal Vdd2 and the transistor Tn has its source electrode connected to the signal ground, represented as a short horizontal line. The combined input/output electrode of the transistor pair Inv7 is connected to the control electrodes of a differential transistor pair Dif by means of a first direct voltage source Vb1 and the second direct voltage source Vb2 of opposite polarity. This differential pair Dif comprises two P-channel MOS transistors T1, T2 whose source electrodes are connected to the second control-signal terminal Vdd2. The sum current Io in the common drain terminal 31 of the differential pair Dif is now equal to:

$$Io = \tfrac{1}{8}\beta p \left\{ 2\left[\frac{\sqrt{(\beta n/\beta p)}}{1 + \sqrt{(\beta n/\beta p)}}(Vdd2 - Vtn - |Vtp|)\right]^2 + 2V_b^2 \right\} \quad (3)$$

where:
- Io = sum current main current path T1, T2 differential pair Dif (A),
- $V_{dd2}$ = direct voltage on the second control-signal terminal (V),
- Vb = direct voltage sources Vb1, Vb2 (V),
- $V_{tn}$ = threshold voltage NMOS transistor Tn Inv7 (v),
- $V_{tp}$ = threshold voltage PMOS transistor Tp Inv7 (V),
- $\beta_n$ = transconductance parameter NMOS transistor Tn Inv7 (A/V$^2$),
- $\beta_p$ = transconductance parameter PMOS Tp Inv7 (A/V$^2$), It follows from equations (2) and (3) that the sum current Io of the differential pair depends upon the transistor parameters in a way similar to the current $I_{dd1}$ in the first control-signal terminal of the oscillator circuit. If in accordance with the invention the current Io is now suitably adapted and applied to the first control-signal terminal Vdd1 of the oscillator circuit, the frequency can be adjusted directly by means of a signal control signal applied to the second input terminal Vdd2 of the oscillator circuit, and a suitable control signal, to be applied to the first control-signal terminal Vdd1 for adjusting the quality factor of the oscillator circuit, is derived by means of the control circuit, as illustrated in FIG. 4.

Owing to their similar structures the transistor pairs of the first and the second type comply with $V_{dd1} \approx V_{dd2}$. It also follows from equations (2) and (3) that, when $$V_b = 1/4 \sqrt{2}\ V_a$$

and the active dimensions of the transistors Tn, Tp of the transistor pair Inv7 of the third type correspond to the corresponding transistors Tn, Tp of a transistor pair Inv1-4 of the first type, the current Io is a factor of four smaller than the current $I_{dd1}$ in the first control-signal terminal Vdd1 of the oscillator circuit.

In the control circuit employed in accordance with the invention, as shown in FIG. 4, the common drain terminal 31 of the differential pair Dif is connected to an input terminal 32 of a first current mirror circuit IM1. This first current mirror circuit IM1 comprises two N-channel MOS transistors T3, T4, arranged as shown. The output terminal 33 of this first current mirror circuit IM1 is connected to the input terminal 34 of a second current mirror circuit IM2, comprising two bipolar PNP transistors Q1, Q2 as shown. The output terminal 35 of this second current mirror circuit IM2 is connected to the first control-signal terminal Vdd1 of the oscillator circuit 30.

The second current mirror circuit IM2 has a power-supply terminal 36 for applying a suitable supply voltage Vd, which should be higher than the control voltage to be applied to the second control-signal terminal Vdd2 of the oscillator circuit 30. The two current mirror circuits IM1, IM2 may each be of a suitable type, comprising insulated-gate transistors or bipolar transistors, suitably formed in the same semiconductor substrate using BIMOS technology. This requires no further explanation for those skilled in the art.

The sum current of the differential pair can be multiplied in different manners. The parameters available for this are the ratio of the forward transconductances of the transistors of the seventh transistor pair Inv7 and the differential pair Dif, and/or the ratio between the input current and the output current of the first current mirror circuit IM1 and the second current mirror circuit IM2.

If the forward transconductance of the transistors T1, T2 of the differential pair Dif differs by a factor y from the forward transconductance of the transistors Tp, Tn of the seventh transistor pair Inv7 and if the ratio between the output current and the input current of the first current mirror circuit IM1 is a factor x and that of the second current mirror circuit IM2 is a factor z, the expression: x.y.z = 4 should be satisfied.

Since the second current mirror circuit IM2 can be energized with a suitable separate supply voltage Vd it is advantageous when the second current mirror circuit supplies the current for the oscillator circuit 30. Consequently, x = y = 1 and z = 4. Adaptation of the forward transconductance of the transistors T1, T2 of the differential pair Dif, for example y = 4, has the advantage that the current mirror circuits can both have a ratio x = z = 1, so that the inevitable quiescent and error currents of the differential pair Dif do not become larger as a result of the presence of the two current mirror circuits IM1, IM2.

As during operation in their saturation region the transistors generally will not comply with the square law relationship between the gate voltage and the drain current as assumed in equations (1-3) upper harmonics of the oscillation frequency f will arise. In order to provide a first control signal for application to a filter (slave), which is as far as possible exempt from said undesirable upper harmonics, there is provided a buffer circuit B comprising a low-pass circuit, which low-pass circuit in FIG. 4 comprises a capacitor C3 connected to the input terminal 37 of the circuit B and the signal ground. This capacitor may be an external capacitor, but it may alternatively be a semiconductor junction in a silicon substrate. The output terminal 38 of the buffer circuit now constitutes the control-signal output terminal Vdd of the oscillator circuit 30 for controlling the quality factor of a filter (slave) in a master-slave filter arrangement as described hereinbefore.

Figure 5A:
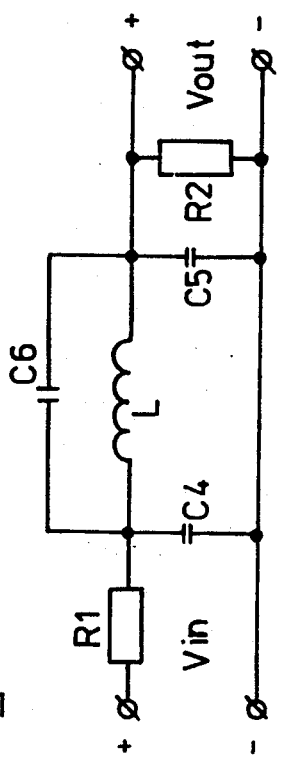
FIG. 5a, b respectively show a filter arrangement comprising passive components and the active equivalent thereof comprising transconductance circuits employed by the invention, with terminals for the connection of an oscillator circuit in accordance with the invention.
Figure 5B:
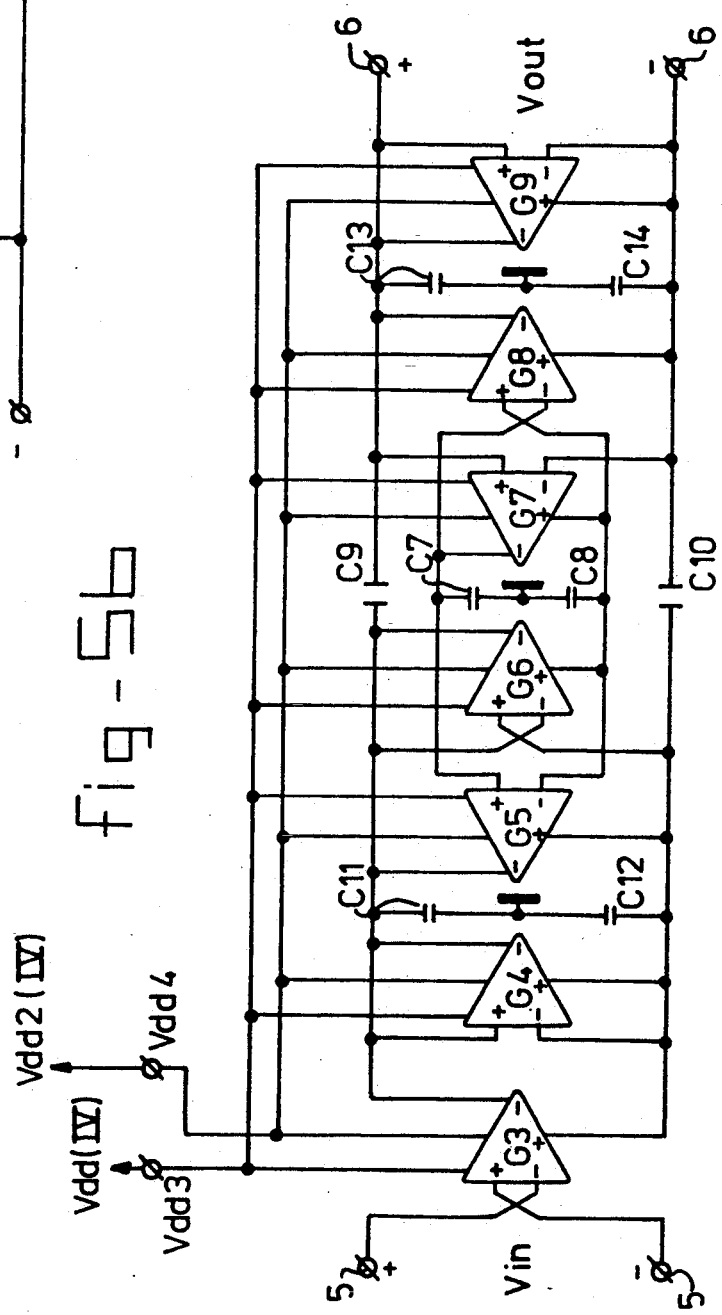

FIG. 5b shows an example of an active filter suitable for use in conjunction with the oscillator circuit. This filter, which comprises balanced transconductance circuits G3-G9 of the type as shown in FIG. 3a, is an active implementation of a third order elliptical filter, whose passive prototype is shown in FIG. 5a.

The inductance L is simulated by means of a gyrator comprising the transconductance circuits G5-G9 and the capacitors C7, C8. The resistors R1, R2 are also implemented by means of transconductance circuits G4 and G9 respectively. The capacitors C7-C14 are suitably selected to provide the desired filter action, as dictated by the capacitors C4, C5 and C6 and the inductance L in FIG. 5a. The first power-supply terminals Vd1 of the transconductance circuits are interconnected and constitute a first control-signal terminal Vdd3 for adjusting the quality factor of the filter arrangement. The second power-supply terminals Vd2 of G3-G9 are interconnected and constitute a second control-signal terminal Vdd4 for applying a control signal for the adjustment of the cut-off frequency of the filter.

The two terminals Vdd3 and Vdd4 of the filter arrangement are therefore suitably connected to the control-signal output terminal Vdd of the control circuit shown in FIG. 4 and the second control-signal terminal Vdd2 thereof, referenced Vdd (IV) and Vdd2 (IV), respectively.

For more information about the filter arrangement reference is made to the afore-mentioned article "A 110 MHz CMOS transconductance-C Low-Pass Filter".

The oscillator circuit in accordance with the invention has been realised with CMOS transistors in an integrated circuit type CA 3600, in which the direct voltage sources Vb1, V2 are adapted to supply a direct voltage higher than or equal to 0.5 V. The maximum value of the voltage Vb1, Vb2 is dictated by the value to which the amplitude Va of the oscillator signal is limited by the supply voltage Vdd2.

I claim:

1. An electrically controllable oscillator circuit (VCO), comprising:

a first (G1) and a second (G2) balanced transconductance circuit, each having a non-inverting (Vi+) and an inverting (Vi−) input terminal, a non-inverting (Vo+) and an inverting (Vo−) output terminal, a first (Vd1) and a second (Vd2) power-supply terminal and a signal ground terminal (E), the non-inverting input terminal (Vi+) of the first transconductance circuit (G1) being connected to the inverting output terminal (Vo−) of the second transconductance circuit (G2), the inverting input terminal (Vi−) of the first transconductance circuit (G1) being connected to the non-inverting output terminal (Vo+) of the second transconductance circuit (G2), the non-inverting output terminal (Vo+) of the first transconductance circuit (G1) being connected to the non-inverting input terminal (Vi+) of the second transconductance circuit (G2), and the inverting output terminal (Vo−) of the first transconductance circuit (G1) being connected to the inverting input terminal (Vi−) of the second transconductance circuit (G2), the first power-supply terminals (Vd1) of the two transconductance circuits being interconnected and constituting a first control-signal terminal (Vdd1), the second power-supply terminals (Vd2) of the two transconductance circuits being interconnected and constituting a second control-signal terminal (Vdd2), and the signal ground terminals (E) of the two transconductance circuits being connected to the signal ground of the oscillator circuit (VCO), first (C1) and second (C2) capacitance means being connected to the output terminals (Vo+, Vo−) of the first and the second transconductance circuit, respectively, during operation, the first and the second transconductance circuit each comprising a first (Inv1), a second (Inv2), a third (Inv3) and a fourth (Inv4) transistor pair of a first type and a fifth (Inv5) and a sixth (Inv6) transistor pair of a second type, each having an input electrode and an output electrode, a power-supply electrode and a signal ground electrode, the input electrode of the first transistor pair (Inv1) being connected to the non-inverting input terminal (Vi+) and the input electrode of the second transistor pair (Inv2) to the inverting input terminal (Vi−), the output electrode of the first transistor pair (Inv1) being connected to the inverting output terminal (Vo−) and the output electrode of the second transistor pair (Inv2) to the non-inverting output terminal (Vo+), the input electrode of the third transistor pair (Inv3) being connected to the output electrode of the first transistor pair (Inv1) and the input electrode of the fifth transistor pair (Inv5) to the output electrode of the second transistor pair (Inv2), said third (Inv3) and said fifth (Inv5) transistor pair having their output electrodes interconnected, the input electrode of the fourth transistor pair (Inv4) being connected to the output electrode of the second transistor pair (Inv2) and the input electrode of the sixth (Inv6) transistor pair to the output electrode of the first transistor pair (Inv1), said fourth (Inv4) and said sixth (Inv6) transistor pair having their output electrodes interconnected, and the power-supply electrodes of the first, the second, the third and the fourth transistor pair being connected to the first power-supply terminal (Vd1), the power-supply electrodes of the fifth and the sixth transistor pair being connected to the second power-supply terminal (Vd2), and the signal ground electrodes of the transistor pairs being connected to the signal ground terminal (E) of the transconductance circuit (G1, G2), a transistor pair of the first type comprising two complementary transistors (Tn, Tp) whose main current paths are arranged in series via a connecting point forming the output electrode and whose control electrodes are interconnected to form the input electrode, said series arrangement having end points constituting the power-supply electrode and the signal ground electrode respectively, whereby in operation the transistors can operate in their saturation regions, and the transistor pair of the second type comprising a structure similar to the transistor pair of the first type but whose input and output electrodes are interconnected, and a control circuit comprising a seventh transistor pair (Inv7) of a third type, whose circuit structure corresponds to that of the transistor pair of the second type and in which the active dimensions of the transistors (Tn, Tp) correspond to those of the corresponding transistors (Tn, Tp) of a transistor pair of the first type, said seventh transistor pair having its power-supply electrode connected to the second control-signal terminal (Vdd2) and its signal ground electrode to the signal ground of the oscillator circuit (VCO), and having its output electrode connected to the control electrodes of a differential transistor pair (Dif) via first (Vb1) and second (Vb2) direct voltage sources of opposite polarity, the main current paths of transistors (T1, T2) of said differential pair (Dif) being coupled in parallel between the second control-signal terminal (Vdd2) and an input (32) of a first current mirror circuit (IM1) having a supply terminal connected to signal ground, which first current mirror circuit has an output (33) connected to an input (34) of a second current mirror circuit (IM2), which second current mirror circuit has a separate power-supply terminal (36), the first control-signal terminal (Vdd1) of the oscillator circuit (VCO) being connected to an output (35) of said second current mirror circuit.

2. An electrically controllable oscillator circuit (VCO) as claimed in claim 1, in which the forward transconductance of the transistors (T1, T2) of the differential pair (Dif) and of the transistors (Tn, Tp) of the seventh transistor pair (Inv7) are substantially equal, and in which the first current mirror circuit (IM1) supplies an output current which is x times as large as its input current and the second current mirror circuit (IM2) supplies an output current which is 4/x times as large as its input current, x being a positive non-zero integer.

3. An electrically controllable oscillator circuit (VCO) as claimed in claim 2, wherein $x=1$.

4. An electrically controllable oscillator circuit (VCO) as claimed in claim 1, in which the forward transconductance of the transistors (T1, T2) of the differential pair (Dif) is y times as large as the forward transconductance of the transistors (Tn, Tp) of the seventh transistor pair (Inv7), and in which the first current mirror circuit (IM1) supplies an output current which is x times as large as its input current and the second current mirror circuit supplies an output current which is 4/(x.y) times as large as its input current, x and y being positive non-zero integers.

5. An electrically controllable oscillator circuit (VCO) as claimed in claim 1 wherein said direct voltage sources (Vb1, Vb2) of opposite polarity supply a direct voltage having an amplitude larger than or equal to 0.5 V.

6. An electrically controllable oscillator circuit (VCO) as claimed in claim 1 wherein the transistors are all of the insulated-gate type and wherein the oscillator circuit (VCO) comprises an integrated semiconductor circuit.

7. An electrically controllable oscillator circuit (VCO) as claimed in claim 6, wherein the transistor geometries are such that in operation the current densities in the transistors are substantially equal.

8. An electrically controllable oscillator circuit (VCO) as claimed in claim 1, further comprising, a buffer circuit (B) having an input terminal (37) and an output terminal (38), the input terminal (37) being connected to the first control-signal terminal (Vdd1) of the oscillator circuit (VCO) via an interposed low-pass filter circuit, the output terminal of the buffer circuit constituting a control-signal output terminal (Vdd) of the oscillator circuit (VCO).

9. An electrically controllable oscillator circuit (VCO) as claimed in claim 8, wherein the low-pass circuit comprises capacitive means coupled between the input terminal of the buffer circuit and the signal ground of the oscillator circuit (VCO).

10. An electrically controllable filter arrangement comprising one or more transconductance circuits (G3-G9) constructed as claimed in claim 1, having a first (Vdd3) and a second (Vdd4) control-signal terminal, and an electrically controllable oscillator circuit (VCO) as claimed in claim 8, wherein the first control-signal terminal (Vdd3) of the filter arrangement is connected to the control-signal output terminal (Vdd) of the oscillator circuit (VCO) and the second control-signal terminal (Vdd4) of the filter arrangement is connected to the second control-signal terminal (Vdd2) of the oscillator circuit (VCO).

11. An electrically controllable oscillator circuit (VCO) as claimed in claim 2 wherein said direct voltage sources (Vb1, Vb2) of opposite polarity supply a direct voltage having an amplitude larger than or equal to 0.5 V.

12. An electrically controllable oscillator circuit (VCO) as claimed in claim 2 further comprising, a buffer circuit having an input terminal and an output terminal, the input terminal being connected to the first control-signal terminal of the oscillator circuit (VCO) via an interposed low-pass filter circuit, the output terminal of the buffer circuit constituting a control-signal output terminal of the oscillator circuit.

13. An electrically controllable oscillator circuit (VCO) as claimed in claim 4 wherein said direct voltage sources (Vb1, Vb2) of opposite polarity supply a direct voltage having an amplitude larger than or equal to 0.5 V.

14. An electrically controllable oscillator circuit (VCO) as claimed in claim 4 further comprising, a buffer circuit having an input terminal and an output terminal, the input terminal being connected to the first control-signal terminal of the oscillator circuit (VCO) via an interposed low-pass filter circuit, the output terminal of the buffer circuit constituting a control-signal output terminal of the oscillator circuit.

* * * * *